US006543017B1

(12) United States Patent
Arai (10) Patent No.: US 6,543,017 B1
(45) Date of Patent: Apr. 1, 2003

(54) SEMICONDUCTOR STORAGE DEVICE (75) Inventor: Minari Arai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/429,328

(22) Filed: Oct. 28, 1999

(30) Foreign Application Priority Data

Oct. 28, 1998 (JP) .......................................... 10-306638

(51) Int. Cl.[7] .............................. G11C 29/00; G11C 7/00
(52) U.S. Cl. ........................................ 714/719; 365/201
(58) Field of Search .............................. 714/719, 735, 714/718; 365/200, 201

(56) References Cited

U.S. PATENT DOCUMENTS

| | | | | |
|---|---|---|---|---|
| 4,924,465 | A | * 5/1990 | Matsubara et al. | 714/703 |
| 5,077,689 | A | * 12/1991 | Ahn | 365/189.01 |
| 5,412,601 | A | * 5/1995 | Sawada et al. | 365/168 |
| 5,428,575 | A | * 6/1995 | Fudeyasu | 365/201 |
| 5,436,912 | A | * 7/1995 | Lustig | 714/719 |
| 5,457,696 | A | * 10/1995 | Mori | 324/210 |
| 5,483,493 | A | * 1/1996 | Shin | 365/189.02 |
| 5,553,082 | A | * 9/1996 | Connor et al. | 714/726 |
| 5,910,923 | A | * 6/1999 | Brown et al. | 365/201 |
| 5,928,373 | A | * 7/1999 | Yoo | 714/718 |
| 5,946,247 | A | * 8/1999 | Osawa et al. | 365/200 |

FOREIGN PATENT DOCUMENTS

JP            9-63298         3/1997

OTHER PUBLICATIONS

Patent Abstracts of JP–62–151773 dated Jun. 7, 1987.
Japanese Office Action dated Mar. 13, 2001, with partial English translation.

* cited by examiner

Primary Examiner—Albert Decady
Assistant Examiner—Joseph D. Torres
(74) Attorney, Agent, or Firm—McGinn & Gibb, PLLC (57) ABSTRACT The invention provides a semiconductor storage device whose memory cell section can be tested in a short time. A read data/comparison data select circuit outputs first bit data before written into a memory section or third bit data read out from the memory cell section. The second bit data from the read data/comparison data select circuit or the first bit data from a serial to parallel conversion circuit are compared with the third bit data read out from the memory cell section by a comparison circuit. The comparison circuit outputs the "H" level when the third bit data and the second bit data or the first bit data coincide with each other, but outputs the "L" level in any other case. Since the semiconductor storage device utilizes the two data for comparison including the first bit data and the second bit data, the number of times of setting of data for comparison can be reduced and the time required for a test of the semiconductor storage device can be reduced.

2 Claims, 8 Drawing Sheets

FIG.8 PRIOR ART

SEMICONDUCTOR STORAGE DEVICE

BACKGROUND OF THE INVENTION

1. Field of the Invention

This present invention relates to a semiconductor storage device, and more particularly to a semiconductor storage device which includes a circuit which performs an operation test of a memory cell section.

2. Description of the Related Art

Figure 8:
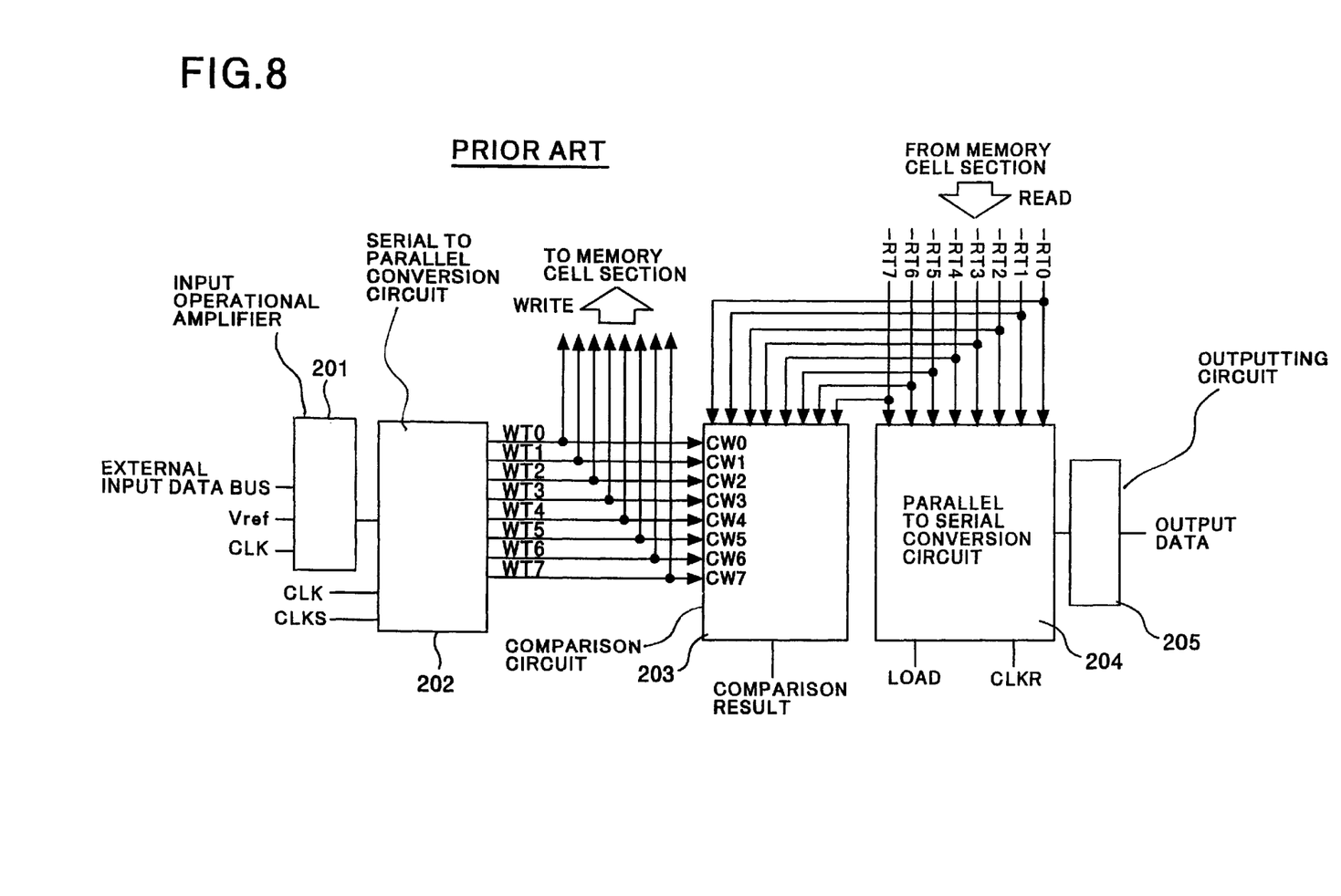
FIG. 8 is a circuit diagram showing a conventional semiconductor storage device.

Various semiconductor storage devices are conventionally known, and one of such conventional semiconductor storage devices is shown in FIG. 8. Referring to FIG. 8, the semiconductor storage device shown includes a memory cell section not shown into and from which data are written and read out, and a circuit for performing an operation test of the memory cell section. The circuit for performing an operation test of the memory cell section includes an input operational amplifier 201 for receiving a signal (serial signal) of an external input data bus, a reference voltage Vref and a clock signal CLK as input signals thereto, a serial to parallel conversion circuit 202 for converting a serial signal outputted from the input operational amplifier 201 into a parallel signal, a comparison circuit 203 for converting the output of the serial to parallel conversion circuit 202 and a signal from the memory cell with each other, a parallel to serial conversion circuit 204 for converting the signal from the memory cell section from a parallel signal into a serial signal, and an outputting circuit 205 for outputting an output signal of the parallel to serial conversion circuit 204 as output data to the outside.

Operation of the semiconductor storage device having the construction described above with reference to FIG. 8 is described. A serial signal from the external input data bus is fetched into the input operational amplifier 201 in synchronism with the clock signal CLK. An output signal of the input operational amplifier 201 is inputted to the serial to parallel conversion circuit 202, by which it is converted into a parallel signal. Bit data WT0 to WT7 of the resulting parallel signal are written into the memory cell section when a control signal for a writing operation is inputted to the memory cell section.

On the other hand, if another control signal for a reading operation is inputted, then bit data RT0 to RT7 are inputted from the memory cell section to the comparison circuit 203. A test of the memory cell section can be performed by reading out the data having been written into the memory cell section and comparing the bit data RT0 to RT7 of the read out data with the bit data WT0 to WT7 which are those before written into the memory cell section, respectively. If the bit data RT0 to RT7 and the bit data WT0 to WT7 coincide with each other respectively, then it can be determined that the memory cell section is normal.

When a testing operation is not performed (when a normal operation is performed), the bit data RT0 to RT7 read out from the memory cell section are fetched into the parallel to serial conversion circuit 204 in synchronism with a loading signal (LOAD). The parallel to serial conversion circuit 204 converts the fetched bit data RT0 to RT7 into a serial signal and outputs the serial signal to the outputting circuit 205 in synchronism with the clock signal CLK. The outputting circuit 205 outputs the data inputted thereto to the external data bus.

The conventional semiconductor storage device, however, is effective only for a test with a single pattern, and where a test with a plurality of patterns (write data pattern, read data check pattern and so forth) is required, write data or read check data must be re-set, and, therefore, a long testing time is required.

SUMMARY OF THE INVENTION

It is an object of the present invention to provide a semiconductor storage device whose memory cell section can be tested in a short time.

In order to attain the object described above, according to an aspect of the present invention, there is provided a semiconductor storage device, comprising a memory cell section into and from which parallel data can be written and read out, and comparison means for selecting one of a plurality of different kinds of parallel data for comparison having different data contents from each other in response to a control signal, comparing the selected data for comparison and parallel read data read out from the memory section with each other and outputting information regarding presence or absence of coincidence between the data for comparison and the read data.

In the semiconductor storage device, when a test of the memory cell section is to be performed, a plurality of kinds of parallel data (write and read check data) for comparison are produced by the comparison section, and a selected one of the comparison data and parallel data read out from the memory cell section are compared with each other. Since a plurality of data for comparison can be prepared, the number of times of setting of data for comparison is reduced or re-setting of check data is not required, and a test of the semiconductor storage device can be completed in a short time.

According to another aspect of the present invention, there is provided a semiconductor storage device, comprising a memory cell section into and from which parallel data can be written and read out, a data select circuit for selectively outputting parallel data before written into the memory cell section or parallel data read out from the memory cell section, a parallel to serial conversion circuit for outputting the parallel data outputted from the data select circuit as first parallel data and for converting the parallel data outputted from the data select circuit into serial data to produce serial output data, an outputting circuit for outputting the serial output data from the parallel to serial conversion circuit to the outside of the semiconductor storage circuit, and a comparison circuit for selecting the first parallel data from the parallel to serial conversion circuit or second parallel data before being written into the memory section as data for comparison, comparing the data for comparison and the data read out from the memory cell section with each other, outputting a determination signal representing coincidence or incoincidence of the data compared with each other, and determining the selected data for comparison as data to be written into the memory cell section.

In the semiconductor storage device, first data for comparison are produced by the data select circuit, and second data for comparison are produced from parallel data before the parallel data are written into the memory cell section. The plurality of data for comparison correspond to a plurality of write check data and a plurality of read check data. Accordingly, the number of times of setting of data for comparison is reduced or re-setting of check data is not required, and the time required for a test of the semiconductor storage device can be reduced.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENT

Figure 1:
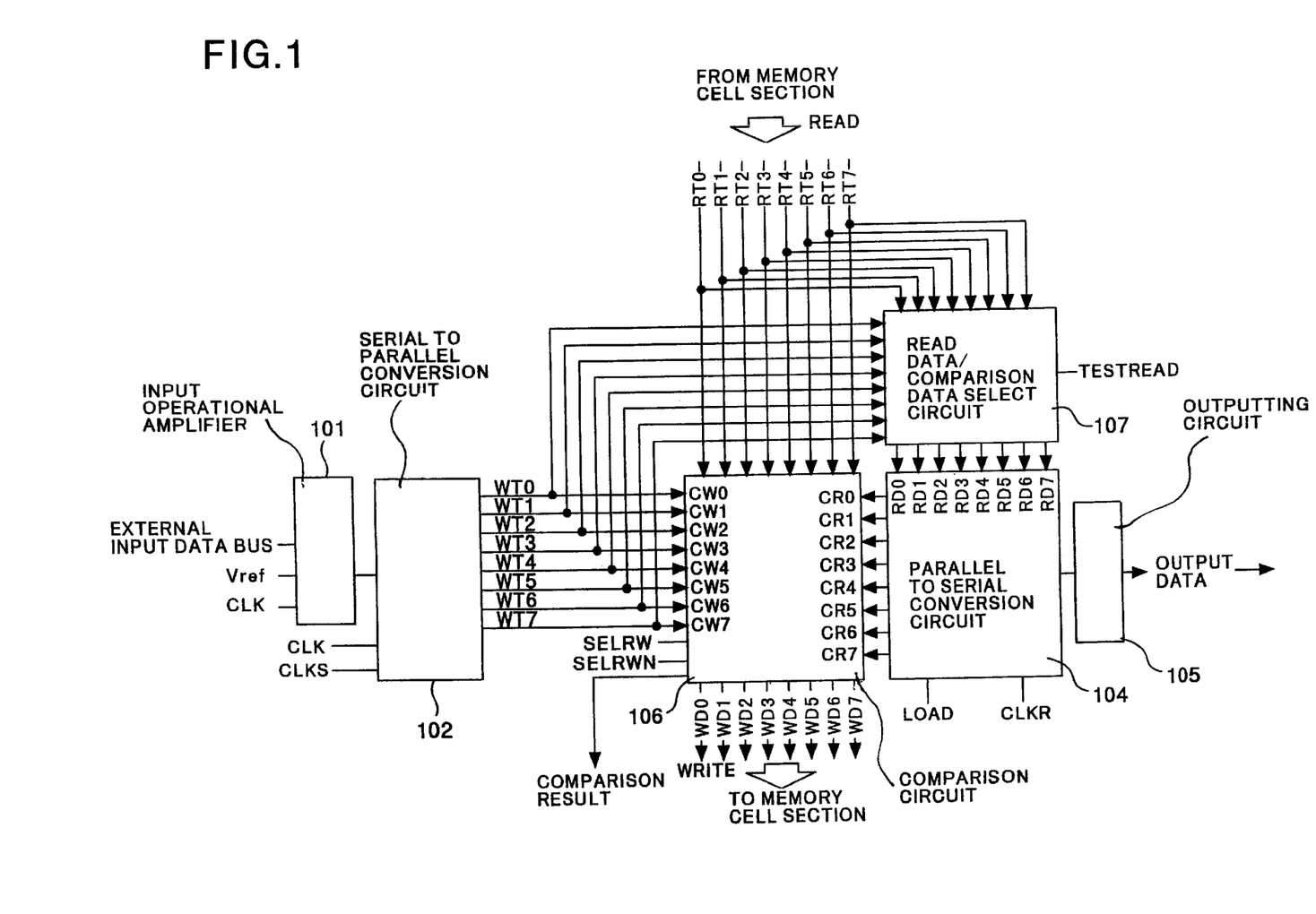
FIG. 1 is a circuit diagram showing a semiconductor storage device to which the present invention is applied.

Referring first to FIG. 1, there is shown a semiconductor storage device to which the present invention is applied. The semiconductor storage device shown includes a memory cell section not shown into and from which data are written and read out, and a circuit for performing an operation test of the memory cell section, similarly to the conventional semiconductor storage device described hereinabove with reference to FIG. 8. The circuit for performing an operation test of the memory cell section includes an input operational amplifier 101 for receiving a signal from an external input data bus not shown, a reference voltage Vref and a clock signal CLK as input signals thereto, a serial to parallel conversion circuit 102 for converting a serial signal from the input operational amplifier 101 into a parallel signal (bit data WT0 to WT7), a parallel to serial conversion circuit 104 for converting bit data RT0 to RT7 from the memory cell section from a parallel signal into a serial signal, an outputting circuit 105 for outputting an output signal of the parallel to serial conversion circuit 104 with a predetermined level, a comparison circuit 106 for comparing an output signal of the serial to parallel conversion circuit 102 and the signal from the memory cell section with each other, and a read data/comparison data select circuit 107 for selecting and outputting the bit data RT0 to RT7 from the memory cell section or the bit data WT0 to WT7 from the serial to parallel conversion circuit 102.

Figure 2:
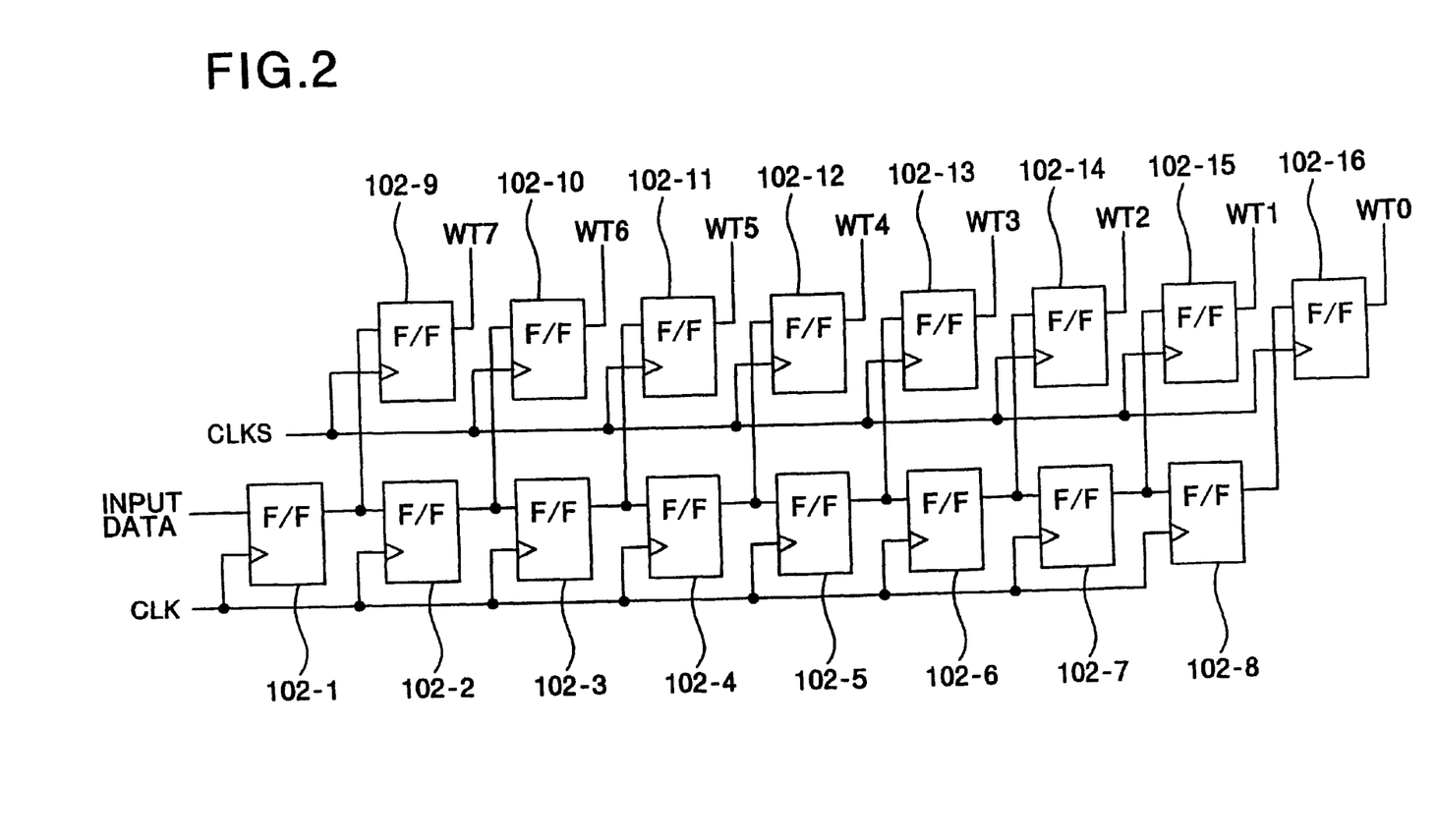
FIG. 2 is a circuit diagram showing a detailed construction of a serial to parallel conversion circuit shown in FIG. 1.

FIG. 2 shows a detailed construction of the serial to parallel conversion circuit 102. Referring to FIG. 2, the serial to parallel conversion circuit 102 shown is a shift register formed from 16 flip-flops (F/F) 102-1 to 102-16. Of the flip-flops 102-1 to 102-16, the flip-flops 102-1 to 102-9 are connected in series, and the clock signal CLK is applied to the flip-flops 102-1 to 102-8 and input data (a serial signal from the external input data bus) is applied to an input terminal of the flip-flop 102-1. The clock signal CLK is applied to the flip-flops 102-9 to 102-16.

An output of the flip-flop 102-1 is inputted to the flip-flop 102-9; an output of the flip-flop 102-2 is inputted to the flip-flop 102-10; an output of the flip-flop 102-3 is inputted to the flip-flop 102-11; an output of the flip-flop 102-4 is inputted to the flip-flop 102-12; an output of the flip-flop 102-5 is inputted to the flip-flop 102-13; an output of the flip-flop 102-6 is inputted to the flip-flop 102-14; an output of the flip-flop 102-7 is inputted to the flip-flop 102-15; and an output of the flip-flop 102-8 is inputted to the flip-flop 102-16. The serial to parallel conversion circuit 102 having the construction described above converts serial input data into 8-bit parallel data (bit data WT0 to WT7) in synchronism with the clock signal CLK or CLKS inputted thereto.

Figure 3:
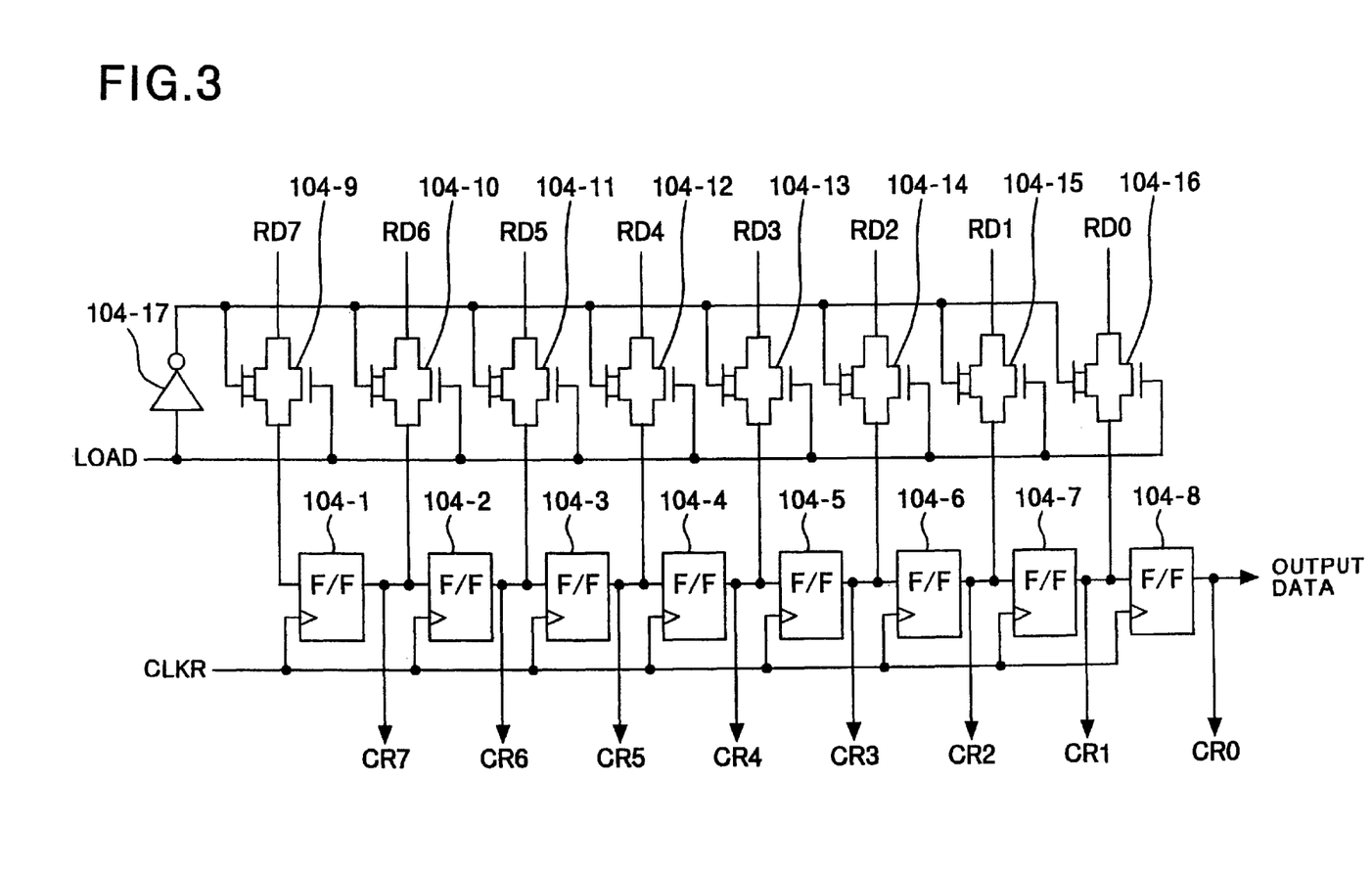
FIG. 3 is a circuit diagram showing a detailed construction of a parallel to serial conversion circuit shown in FIG. 1.

FIG. 3 shows a detailed construction of the parallel to serial conversion circuit 104. Referring to FIG. 3, the parallel to serial conversion circuit 104 shown includes eight flip-flops 104-1 to 104-8, eight transistor switches 104-9 to 104-16, and an inverter 104-17. The flip-flops 104-1 to 104-8 are connected in series, and output data of them is outputted from the flip-flop 104-8. The transistor switches 104-9 to 104-16 have the same construction and are each formed from an n-MOS FET and a p-MOS FET. The drains and the sources of the n-MOS FETs and the p-MOS FETs are individually connected commonly, and the LOAD signal is applied to the gates of the n-MOS FETs while a signal obtained by inverting the LOAD signal by means of the inverter 104-17 is applied to the gates of the p-MOS FETs. When the LOAD signal is applied to the gates of the n-MOS FETs and the LOAD bar signal is applied to the gates of the p-MOS FETs, the transistor switches 104-9 to 104-16 are rendered conducting, and consequently, read out bit data RD-7 to RD-0 applied to the drains of the transistor switches or semiconductor switches 104-9 to 104-16 are transmitted to the corresponding flip-flops 104-1 to 104-8, respectively. The relationship among the inputs and outputs of the flip-flops 104-1 to 104-8 and the transistor switches 104-9 to 104-16 is illustrated in Table 1 below. It is to be noted that serial data is produced by the flip-flops 104-1 to 104-8 and corresponding serial output data is outputted from the flip-flop 104-8.

TABLE 1

| Input data | Semiconductor switch | F/F | Parallel output data | Serial conversion output |
|---|---|---|---|---|
| RD0 | 104-16 | 104-8 | CR0 | CR0 |
| RD1 | 104-15 | 104-7 | CR1 | |
| RD2 | 104-14 | 104-6 | CR2 | |
| RD3 | 104-13 | 104-5 | CR3 | |
| RD4 | 104-12 | 104-4 | CR4 | |
| RD5 | 104-11 | 104-3 | CR5 | |
| RD6 | 104-10 | 104-2 | CR6 | |
| RD7 | 104-9 | 104-1 | CR7 | |

Figure 4:
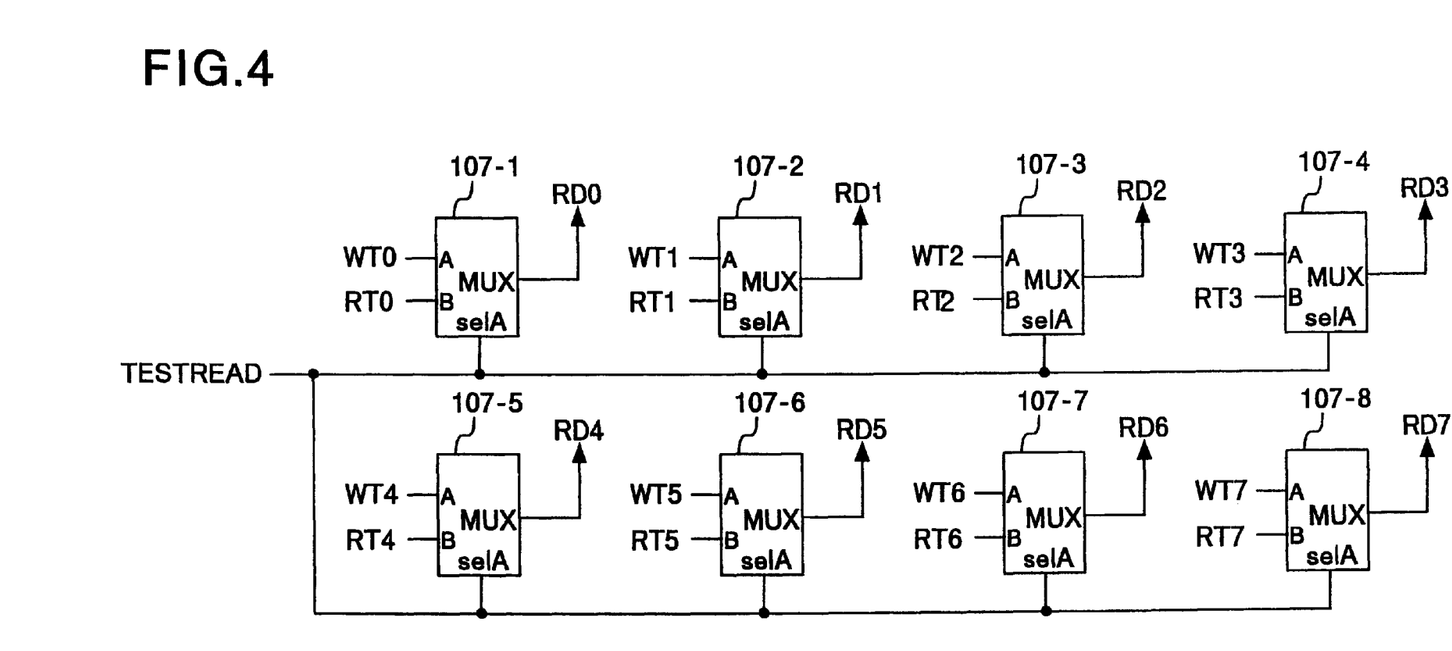
FIG. 4 is a circuit diagram showing a detailed construction of a read data/comparison data select circuit shown in FIG. 1.

FIG. 4 shows a detailed construction of the read data/comparison data select circuit 107. Referring to FIG. 4, the read data/comparison data select circuit 107 shown includes eight multiplexers (MUX) 107-1 to 107-8 having the same construction as each other. The bit data WT0 to WT7 from the flip-flops 102-9 to 102-16 and the bit data RT0 to RT7 from the memory cell section are inputted to A input terminals and B input terminals of the multiplexers 107-1 to 107-8, respectively. The bit data WT0 to WT7 or the bit data RT0 to RT7 are selected in response to the state of a TESTREAD signal (signal indicating execution of a test) applied to selA terminals of the multiplexers 107-1 to 107-8 by the multiplexers 107-1 to 107-8 and outputted as bit data RD0 to RD7 from the multiplexers 107-1 to 107-8, respectively.

Figure 5:
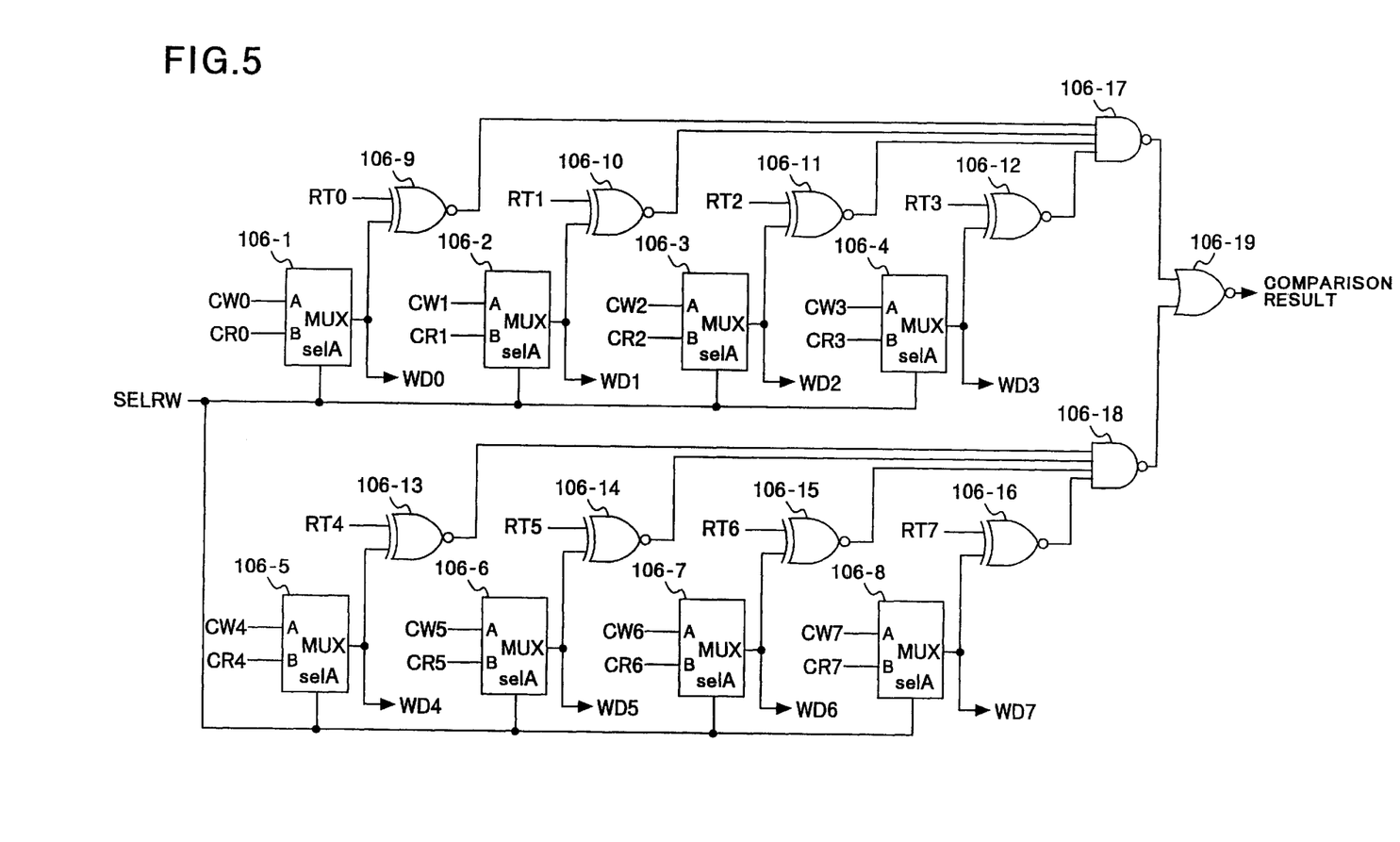
FIG. 5 is a circuit diagram showing a detailed construction of a comparison circuit shown in FIG. 1.

FIG. 5 shows a detailed construction of the comparison circuit 106. Referring to FIG. 5, the comparison circuit 106 shown includes eight multiplexers (MUX) 106-1 to 106-8, eight exclusive NOR (Ex-NOR) circuits 106-9 to 106-16, a pair of NAND circuits 106-17 and 106-18, and a NOR circuit 106-19. Bit data CR0 to CR7 from the parallel to serial conversion circuit 104 and bit data CW0 to CW7 from the serial to parallel conversion circuit 102 are inputted to the multiplexers 106-1 to 106-8, respectively. The bit data CR0 to CR7 and the bit data CW0 to CW7 provide two different data patterns (write and read check data). A SELRW signal for indicating writing or reading out is applied to selA terminals of the multiplexers 106-1 to 106-8. Further, the bit data RT0 to RT7 from the memory cell section and output bit data WD0 to WD7 of the multiplexers 106-1 to 106-8 are inputted to input terminals of the exclusive NOR circuits 106-9 to 106-16, respectively.

Ones of pairs of input terminals of the exclusive NOR circuits 106-9 to 106-16 are connected to output terminals of the multiplexers 106-1 to 106-8, respectively. Outputs of the four exclusive NOR circuits 106-9 to 106-12 are inputted to the NAND circuit 106-17. Similarly, outputs of the remaining four exclusive NOR circuits 106-13 to 106-16 are inputted to the other NAND circuit 106-18. Input terminals of the NOR circuit 106-19 are connected to output terminals of the NAND circuits 106-17 and 106-18, and a result of comparison is outputted from an output terminal of the NOR circuit 106-19.

In the comparison circuit 106 of FIG. 5, when the control signal indicates a writing operation, if the SELRW signal has the "H" level, then the bit data CW0 to CW7 are taken out as bit data WD0 to WD7, respectively, and written into the memory cell section, but if the SELRW signal has the "L" level, then the bit data CR0 to CR7 are taken out as bit data WD0 to WD7, respectively, and written into the memory cell section. On the other hand, when the control signal indicates a reading operation, the bit data RT0 to RT7 read out from the memory cell section and comparison data selected by the multiplexers 106-1 to 106-8 are compared with each other by the exclusive NOR circuits 106-9 to 106-16, respectively. A result of the comparison is determined by the 4-input NAND circuits 106-17 and 106-18 and the NOR circuit 106-19. If all of the comparison data (bit data WD0 to WD7) selected by the multiplexers 106-1 to 106-8 and the bit data RT0 to RT7 coincide with each other, respectively, then the "H" level is outputted from the NOR circuit 106-19, but in any other case, that is, if a difference is detected at any of the bits, the "L" level is outputted from the NOR circuit 106-19.

Subsequently, operation of the semiconductor storage device is described.

Figure 6:
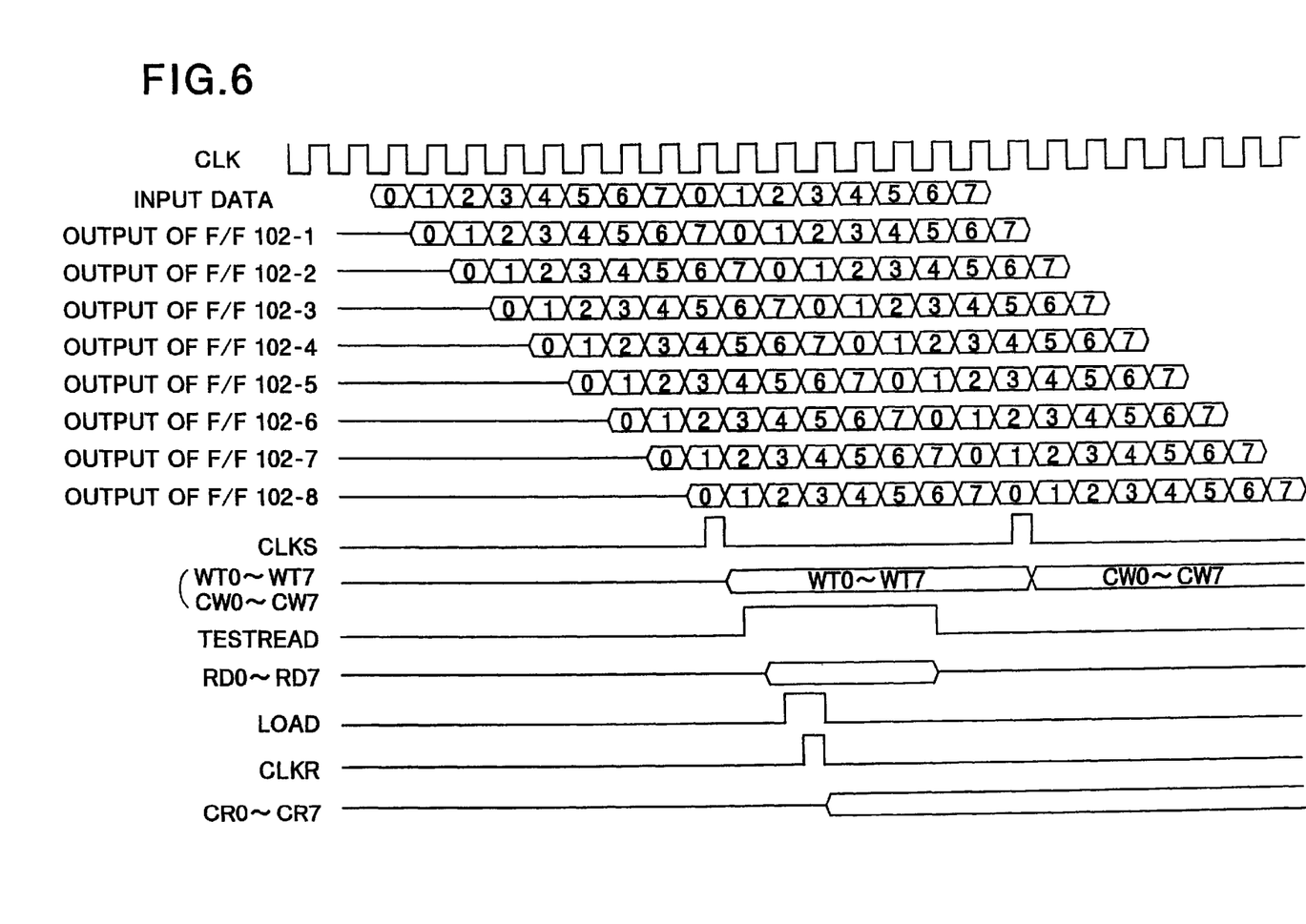
FIG. 6 is a timing chart illustrating operation of the semiconductor storage device of FIG. 1.

FIG. 6 illustrates operation of the semiconductor storage device of FIG. 1. Referring to FIGS. 1 and 6, data from the external input data bus is fetched by the input operational amplifier 101 and inputted in synchronism with the clock signal CLK to the serial to parallel conversion circuit 102, by which it is converted into a parallel signal of eight bit data WT0 to WT7. The bit data WT0 to WT7 are inputted to the read data/comparison data select circuit 107 and the comparison circuit 106. The bit data WT0 to WT7 inputted to the comparison circuit 106 are treated as bit data CW0 to CW7 in the comparison circuit 106.

Upon a reading operation, the data RT0 to RT7 read out from the memory cell section and inputted to the read data/comparison data select circuit 107 are selected by the read data/comparison data select circuit 107 and fetched into the parallel to serial conversion circuit 104 in response to the LOAD signal applied to the parallel to serial conversion circuit 104. In a normal operation different from a testing operation, the bit data RD0 to RD7 are outputted to the outputting circuit 105 in synchronism with the clock signal CLKR and outputted as output data from the outputting circuit 105 to the outside. On the other hand, the bit data RD0 to RD7 fetched into the parallel to serial conversion circuit 104 are inputted as bit data CR0 to CR7 to the comparison circuit 106, respectively. The SELRW signal and a SELRWN signal for selecting data for comparison are inputted to the comparison circuit 106. Data selected with the SELRW signal and the SELRWN signal are outputted as bit data WD0 to WD7 to and written as write data into the memory cell section.

First, a normal operation (different from a testing operation) is described. If the control signal indicates a writing operation, then the SELRW signal exhibits the "H" level, and the bit data WT0 to WT7 inputted to the comparison circuit 106 are treated as bit data CW0 to CW7 in the internal bus of the comparison circuit 106 and then treated as bit data WD0 to WD7 through the multiplexers 106-1 to 106-8 of FIG. 5 and finally written into the memory cell section. Then, if the control signal indicates a reading operation, then bit data RT0 to RT7 read out from the memory cell section are inputted to the read data/comparison data select circuit 107. In this instance, since not a testing operation but a normal operation is to be performed, the TESTREAD signal has the "H" level. Accordingly, the bit data RT0 to RT7 are treated as they are as bit data RD0 to RD7 by the multiplexers 107-1 to 107-8 in the read data/comparison data select circuit 107. The bit data RD0 to RD7 are fetched into the parallel to serial conversion circuit 104 in synchronism with the LOAD signal. The parallel data thus fetched is converted into a serial signal by the parallel to serial conversion circuit 104 and outputted to the outputting circuit 105 in synchronism with the clock signal CLKR.

Now, an operation upon testing is described. When the control signal indicates setting of write-read data check data, data inputted serially from the external input data bus is fetched into the input operational amplifier 101 and then converted into parallel bit data WT0 to WT7 by the serial to parallel conversion circuit 102. The bit data WT0 to WT7 are inputted to the comparison circuit 106 and the read data/comparison data select circuit 107. In this stage, setting of one write-read data check data (bit data CW0 to CW7) is completed. If, in this state, the TESTREAD signal inputted to the read data/comparison data select circuit 107 changes to the "H" level, then the bit data WT0 to WT7 are inputted to the parallel to serial conversion circuit 104, in which they are latched into the flip-flops 104-1 to 104-8 of the parallel to serial conversion circuit 104 in response to the LOAD signal and the clock signal CLKR for one cycle. The latched data is treated as second write-read data check data (bit data CR0 to CR7).

When the control signal indicates a writing operation, if the SELRW signal of the comparison circuit 106 has the "H" level, then the bit data CW0 to CW7 are written into the memory cell section, but if the SELRW signal has the "L" level, then the bit data CR0 to CR7 are written into the memory cell section. On the other hand, when the control signal indicates a reading operation, the bit data RT0 to RT7 read out from the memory cell section are inputted to the comparison circuit 106. As seen from FIG. 5, if the SELRW signal has the "H" level, then the bit data RT0 to RT7 and the bit data WD0 to WD7 selected by the multiplexers 106-1 to 106-8 are compared with each other by the exclusive NOR circuits 106-9 to 106-16, respectively. A result of the comparison is determined by the 4-input NAND circuits 106-17 and 106-18 and the NOR circuit 106-19. If all of the bit data WD0 to WD7 and the bit data RT0 to RT7 coincide with each other, respectively, then the "H" level is outputted from the NOR circuit 106-19, but in any other case, the "L" level is outputted as a result of the comparison.

Figure 7:
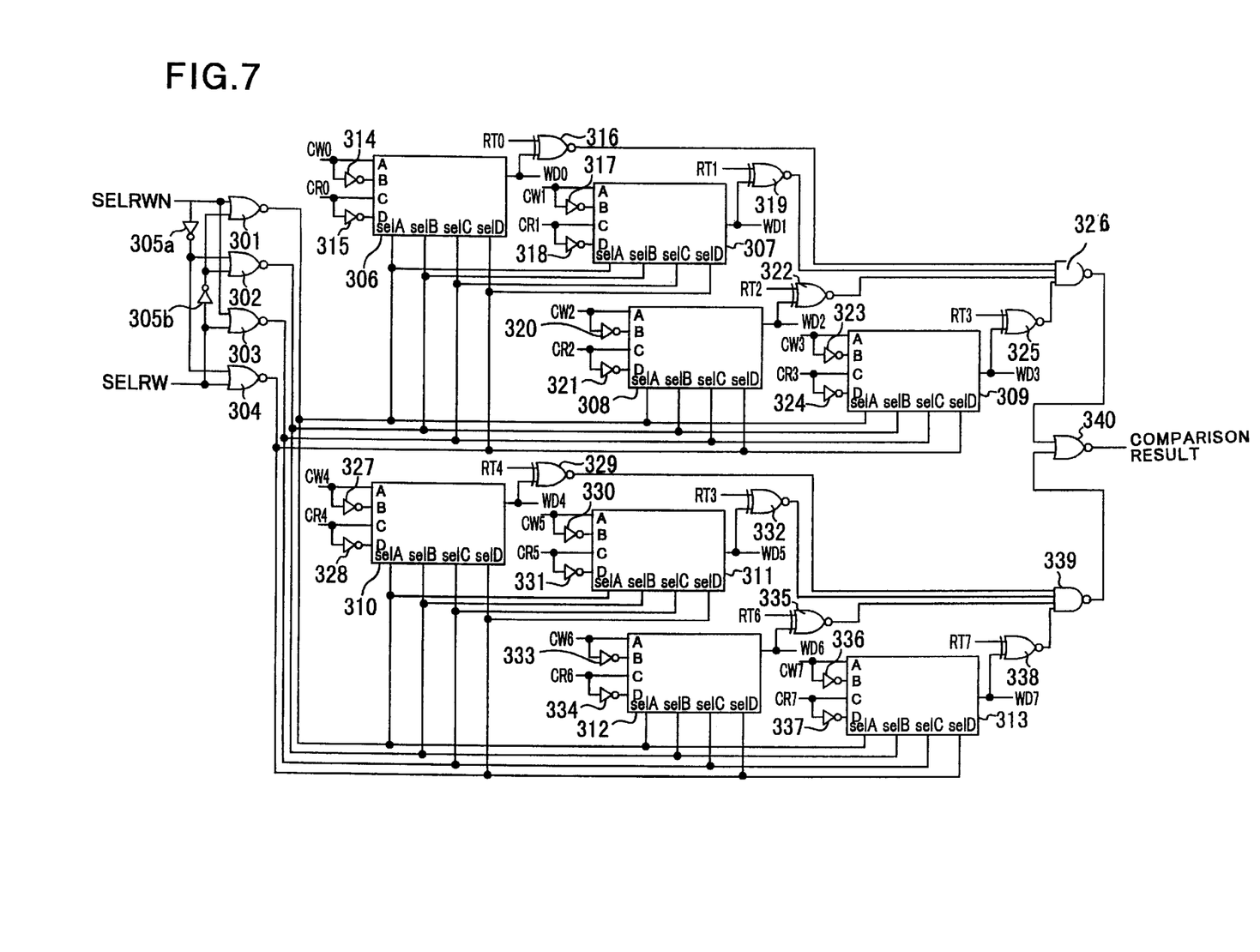
FIG. 7 is a circuit diagram showing a detailed construction of another form of the comparison circuit employed in the semiconductor storage device of FIG. 1.

FIG. 7 shows a construction of another form of the comparison circuit of the semiconductor memory device of FIG. 1. Referring to FIG. 7, the comparison circuit shown uses four different comparison data including inverted data. The comparison circuit includes three NOR circuits 301, 302, 303 and 304, a pair of invertors 305a and 305b, eight multiplexers 306, 307, 308, 309, 310, 311, 312 and 313, another pair of invertors 314 and 315, an exclusive NOR circuit 316, a further pair of invertors 317 and 318, another exclusive NOR circuit 319, a still further pair of invertors 320 and 321, a further exclusive NOR circuit 322, a yet further pair of invertors 323 and 324, a still further exclusive NOR circuit 325, a NAND circuit 326, a yet further pair of invertors 327 and 328, a yet further exclusive NOR circuit 329, a yet further pair of invertors 330 and 331, a yet further exclusive NOR circuit 332, a yet further pair of invertors 333 and 334, a yet further exclusive NOR circuit 335, a yet further pair of invertors 336 and 337, a yet further exclusive NOR circuit 338, another NAND circuit 339, and a further NOR circuit 340. Each of the multiplexers 306 to 313 selects one data from four different data.

A SELRWN signal and a SELRW bar signal (produced by the invertor 305b) are inputted to the NOR circuit 301, and a SELRWN bar signal (produced by the invertor 305a) and the SELRW bar signal are inputted to the NOR circuit 302. Further, the SELRWN signal and a SELRW signal are inputted to the NOR circuit 303, and the SELRW signal and the SELRWN bar signal are inputted to the NOR circuit 304. Output signals of the NOR circuits 301 to 304 are inputted to select terminals selA, selB, selC and selD of the multiplexers 306 to 313, respectively.

The bit data CW0 is inputted to an A terminal of the multiplexer 306, and a bit data CW0 bar obtained by inverting the bit data CW0 by means of the invertor 314 is inputted to a B terminal of the multiplexer 306. The bit data CR0 is inputted to a C terminal of the multiplexer 306, and a bit data CR0 bar obtained by inverting the bit data CR0 by means of the invertor 315 is inputted to a D terminal of the multiplexer 306. A first input terminal of the exclusive NOR circuit 316 is connected to an output terminal of the multiplexer 306 from which the bit data WD0 is outputted, and the bit data RT0 is inputted to a second input terminal of the exclusive NOR circuit 316. The bit data CW1 is inputted to an A terminal of the multiplexer 307, and a bit data CW1 bar obtained by inverting the bit data CW1 by means of the invertor 317 is inputted to a B terminal of the multiplexer 307. A first input terminal of the exclusive NOR circuit 319 is connected to an output terminal of the multiplexer 307 from which the bit data WD1 is outputted, and the bit data RT1 is inputted to a second input terminal of the exclusive NOR circuit 319. The bit data CW2 is inputted to an A terminal of the multiplexer 308, and a bit data CW2 bar obtained by inverting the bit data CW2 by means of the invertor 320 is inputted to a B terminal of the multiplexer 308. The bit data CR2 is inputted to a C terminal of the multiplexer 308, and a bit data CR2 bar obtained by inverting the bit data CR2 by means of the invertor 321 is inputted to a D terminal of the multiplexer 308. A first input terminal of the exclusive NOR circuit 322 is connected to an output terminal of the multiplexer 308 from which the bit data WD2 is outputted, and the bit data RT2 is inputted to a second input terminal of the exclusive NOR circuit 322. The bit data CW3 is inputted to an A terminal of the multiplexer 309, and a bit data CW3 bar obtained by inverting the bit data CW3 by means of the invertor 323 is inputted to a B terminal of the multiplexer 309. A first input terminal of the exclusive NOR circuit 325 is connected to an output terminal of the multiplexer 309 from which the bit data WD3 is outputted, and the bit data RT3 is inputted to a second input terminal of the exclusive NOR circuit 325.

The bit data CW4 is inputted to an A terminal of the multiplexer 310, and a bit data CW4 bar obtained by inverting the bit data CW4 by means of the invertor 327 is inputted to a B terminal of the multiplexer 310. The bit data CR4 is inputted to a C terminal of the multiplexer 310, and a bit data CR4 obtained by inverting the bit data CR4 by means of the invertor 328 is inputted to a D terminal of the multiplexer 310. A first input terminal of the exclusive NOR circuit 329 is connected to an output terminal of the multiplexer 310 from which the bit data WD4 is outputted, and the bit data RT4 is inputted to a second input terminal of the exclusive NOR circuit 329. The bit data CW5 is inputted to an A terminal of the multiplexer 311, and a bit data CW5 bar obtained by inverting the bit data CW5 by means of the invertor 330 is inputted to a B terminal of the multiplexer 311. The bit data CR5 is inputted to a C terminal of the multiplexer 311, and a bit data CR5 bar obtained by inverting the bit data CR5 by means of the invertor 331 is inputted to a D terminal of the multiplexer 311. A first input terminal of the exclusive NOR circuit 332 is connected to an output terminal of the multiplexer 311 from which the bit data WD5 is outputted, and the bit data RT5 is inputted to a second input terminal of the exclusive NOR circuit 332.

The bit data CW6 is inputted to an A terminal of the multiplexer 312, and a bit data CW6 bar obtained by inverting the bit data CW6 by means of the invertor 333 is inputted to a B terminal of the multiplexer 312. The bit data CR6 is inputted to a C terminal of the multiplexer 312, and a bit data CR6 bar obtained by inverting the bit data CR6 by means of the invertor 334 is inputted to a D terminal of the multiplexer 312. A first input terminal of the exclusive NOR circuit 335 is connected to an output terminal of the multiplexer 312 from which the bit data WD6 is outputted, and the bit data RT6 is inputted to a second input terminal of the exclusive NOR circuit 335. The bit data CW7 is inputted to an A terminal of the multiplexer 313, and a bit data CW7 bar obtained by inverting the bit data CW7 by means of the invertor 336 is inputted to a B terminal of the multiplexer 313. The bit data CR7 is inputted to a C terminal of the multiplexer 313, and a bit data CR7 bar obtained by inverting the bit data CR5 by means of the invertor 331 is inputted to a D terminal of the multiplexer 313. A first input terminal of the exclusive NOR circuit 338 is connected to an output terminal of the multiplexer 313 from which the bit data WD7 is outputted, and the bit data RT7 is inputted to a second input terminal of the exclusive NOR circuit 338.

Input terminals of the 4-input NAND circuit 326 are connected to output terminals of the exclusive NOR circuits 316, 319, 322 and 325; input terminals of the 4-input NAND circuit 339 are connected to output terminals of the exclusive NOR circuits 329, 332, 335 and 339. The NOR circuit 340 is connected to output terminals of the NAND circuit 339 and the NAND circuit 326, and a result of comparison is outputted from an output terminal of the NOR circuit 340.

The semiconductor storage device which employs the comparison circuit described above with reference to FIG. 7 when the control signal indicates setting of write-read check data operates similarly to that where the semiconductor storage device employs the comparison circuit described hereinabove above with reference to FIG. 5, and overlapping description of it is omitted here to avoid redundancy. On the other hand, when the control signal indicates a writing operation, the semiconductor storage device can obtain the following write-read check data depending upon the states of the SELRW signal and the SELRWN signal.

(1) When the SELRW signal has the "H" level and the SELRWN signal has the "L" level, the A input terminals of the multiplexer 306 to 313 are selected so that the bit data CW0 to CW7 are outputted as bit data WD0 to WD7 from the multiplexer 306 to 313, respectively.

(2) When the SELRW signal has the "H" level and the SELRWN signal has the "H" level, the B input terminals of the multiplexer 306 to 313 are selected so that the inverted bit data from the bit data CW0 to CW7 are outputted as bit data WD0 to WD7 from the multiplexer 306 to 313, respectively.

(3) When the SELRW signal has the "L" level and the SELRWN signal has the "L" level, the C input terminals of the multiplexer 306 to 313 are selected so that the bit data CR0 to CR7 are outputted as bit data WD0 to WD7 from the multiplexer 306 to 313, respectively.

(4) When the SELRW signal has the "L" level and the SELRWN signal has the "H" level, the D input terminals of the multiplexer 306 to 313 are selected so that the inverted bit data from the bit data CR0 to CR7 are outputted as bit data WD0 to WD7 from the multiplexer 306 to 313, respectively.

The bit data WD0 to WD7 in (1) to (4) above are written into the memory cell section.

Subsequently, operation of the semiconductor storage device of FIG. 1 where it employs the comparison circuit of FIG. 7 when the control signal indicates a reading operation is described. As seen from FIG. 7, comparison data (one of the four different kinds of bit data WD0 to WD7 given in (1) to (4) above) selected by the multiplexers 306 to 313 and the bit data RT0 to RT7 read out from the memory cell section are compared with each other by the exclusive NOR circuits 316, 319, 322, 325, 329, 332, 335 and 338, respectively. If it is determined by the NAND circuits 326 and 339 that the bit data WD0 to WD7 and the bit data RT0 to RT7 all coincide with each other, respectively, then the "H" level is outputted as a "comparison result" from the NOR circuit 340. In any other case, the "L" level is outputted from the NOR circuit 340.

While a preferred embodiment of the present invention has been described using specific terms, such description is for illustrative purposes only, and it is to be understood that changes and variations may be made without departing from the spirit or scope of the following claims.

What is claimed is:

1. A semiconductor storage device, comprising:

a memory cell section into and from which parallel data can be written and read out;

a comparison data select circuit for selectively outputting parallel data, said comparison data select circuit receiving as parallel data inputs a first input being parallel data before written into said memory cell section and a second input being parallel data read out from said memory cell section;

a parallel to serial conversion circuit for outputting the parallel data outputted from said comparison data select circuit as first parallel data and for converting the parallel data outputted from said data select circuit into serial output data;

an outputting circuit for outputting the serial output data from said parallel to serial conversion circuit to the outside of said semiconductor storage circuit; and a comparison circuit for selecting the first parallel data from said parallel to serial conversion circuit or a second parallel data being data before being written into said memory section as data for comparison, for comparing the selected one of data for comparison with data read out from said memory cell section, and for determining the selected data for comparison as data to be written into said memory cell section.

2. A semiconductor storage device as claimed in claim 1, wherein said comparison circuit additionally has as the possible data for comparison, a third parallel data obtained by inverting the parallel data from said data select circuit, and a fourth parallel data obtained by inverting the parallel data before written into said memory cell section.

* * * * *